(12) United States Patent
Lee et al.

(10) Patent No.: US 7,851,992 B2
(45) Date of Patent: *Dec. 14, 2010

(54) ORGANIC LIGHT EMITTING DIODE DISPLAY

(75) Inventors: Sung-Soo Lee, Suwon-si (KR); Jun-Ho Choi, Yongin-si (KR); Chang-Woong Chu, Suwon-si (KR); Seong-Min Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 161 days.

This patent is subject to a terminal disclaimer.

(21) Appl. No.: 12/112,561

(22) Filed: Apr. 30, 2008

(65) Prior Publication Data

US 2009/0200921 A1    Aug. 13, 2009

(30) Foreign Application Priority Data

Feb. 12, 2008  (KR) .................. 10-2008-0012622

(51) Int. Cl.
*H05B 33/26* (2006.01)
(52) U.S. Cl. ...................... 313/504; 313/506
(58) Field of Classification Search ........ None
See application file for complete search history.

(56) References Cited

U.S. PATENT DOCUMENTS

| | | | |
|---|---|---|---|
| 5,554,911 A | 9/1996 | Nakayama et al. | |
| 7,271,537 B2 | 9/2007 | Matsuda et al. | |
| 2005/0225237 A1 | 10/2005 | Winters | |
| 2007/0015429 A1 | 1/2007 | Maeda et al. | |
| 2007/0024186 A1 | 2/2007 | Chen et al. | |
| 2007/0200123 A1 | 8/2007 | Yamamichi et al. | |
| 2008/0048560 A1 | 2/2008 | Sung et al. | |
| 2008/0122347 A1 | 5/2008 | Lee | |
| 2009/0091238 A1 | 4/2009 | Cok et al. | |

FOREIGN PATENT DOCUMENTS

| | | |
|---|---|---|
| JP | 2006-261094 | 9/2006 |
| JP | 2006-269327 | 10/2006 |
| JP | 2006-269329 | 10/2006 |
| JP | 2007-115626 | 5/2007 |
| JP | 2007-134153 | 5/2007 |
| KR | 1020050031955 A | 4/2005 |
| KR | 1020060043262 A | 5/2006 |
| KR | 1020060046476 A | 5/2006 |
| KR | 1020070017360 A | 2/2007 |

*Primary Examiner*—Toan Ton
*Assistant Examiner*—Britt D Hanley
(74) *Attorney, Agent, or Firm*—Cantor Colburn LLP

(57) ABSTRACT

An organic light emitting diode ("OLED") display includes first to third pixels each displaying a different color, wherein each pixel includes a first electrode, a second electrode facing the first electrode, and an emission layer positioned between the first and second electrodes, wherein first electrodes of first and second pixels are a single layer including a conductive oxide, respectively. A first electrode of the third pixel includes a lower first electrode including a conductive oxide, an intermediate first electrode formed on the lower first electrode and including a semitransparent conductor which forms microcavities with the second electrode, and an upper first electrode formed on the intermediate first electrode and including a conductive oxide. A method for manufacturing the OLED is also disclosed.

13 Claims, 20 Drawing Sheets

ORGANIC LIGHT EMITTING DIODE DISPLAY

This application claims priority to Korean Patent Application No. 10-2008-0012622, filed on Feb. 12, 2008, and all the benefits accruing therefrom under 35 U.S.C. §119, the entire contents of which in its entirety are herein incorporated by reference.

BACKGROUND OF THE INVENTION (a) Field of the Invention

The present invention relates to an organic light emitting diode ("OLED") display and a manufacturing method thereof.

(b) Description of the Related Art

Recently, as demands for lighter or thinner monitors or TVs have been increasing, cathode ray tubes ("CRTs") are being replaced by liquid crystal displays ("LCDs"). However, as light-receiving devices, the LCDs are disadvantageous in that they require a light source such as a backlight and have many limitations in terms of response speed and viewing angle.

Recently, OLED displays have received much attention as display devices that can overcome such limitations of the LCDs. The OLED display includes two electrodes and an emission layer sandwiched therebetween, in which electrons injected from one electrode and holes injected from the other electrode are recombined in the emission layer to form excitons, and as the excitons release energy, the OLED display is illuminated.

The OLED display is a self-emission type of display that does not require a light source such as a backlight, so it is advantageous in terms of power consumption. Furthermore, the OLED display has good response speed, viewing angle and contrast ratio.

The OLED display includes a plurality of pixels such as red pixels, blue pixels and green pixels. A full color spectrum can be expressed by combining the various red pixels, blue pixels and green pixels.

In this case, the red pixel, the blue pixel and the green pixel include a red emission layer, a blue emission layer and a green emission layer, respectively, to express color. The emission layers may be deposited pixel-by-pixel using a fine shadow mask. However, as the size of the display device is increased, there is a limitation in depositing such emission layers at each pixel when using the fine shadow mask.

Therefore, a technique has been proposed in which the red emission layer, the blue emission layer and the green emission layer are sequentially stacked on the entire display device using an open mask to emit white light. Color filters are disposed at positions where the emitted light passes through to thus express red, green and blue colors by pixel.

However, due to the limitation in color reproducibility of the color filters themselves, light that passes through the color filters is bound to have color reproducibility which at best may be the same as, or more likely lower than the color reproducibility of the color filters. As a result of the limitation in color reproducibility of the color filters, such high color reproducibility as required by the National Television Systems Committee ("NTSC") is difficult to achieve from the light that passes through the color filters.

BRIEF SUMMARY OF THE INVENTION

The present invention has been made in an effort to provide an organic light emitting diode ("OLED") display having aspect, features and advantages of achieving high color reproducibility with white emission.

An exemplary embodiment of the present invention provides an organic light emitting diode ("OLED") display including: first to third pixels each displaying a different color, wherein each pixel includes a first electrode, a second electrode facing the first electrode, and an emission layer sandwiched between the first and second electrodes, wherein first electrodes of the first and second pixels are a single layer including a conductive oxide, respectively, and a first electrode of the third pixel includes a lower first electrode including a conductive oxide; an intermediate first electrode formed on the lower first electrode and including a semitransparent conductor which forms microcavities with the second electrode; and an upper first electrode formed on the intermediate first electrode and including a conductive oxide.

The first pixel may be a red pixel, the second pixel may be a blue pixel and the third pixel may be a green pixel.

The emission layer may include a plurality of sub-emission layers, each emitting light of a different wavelength, and which emit white light by combining the lights of different wavelengths.

The emission layer may include a first sub-emission layer which emits light of a first color, a second sub-emission layer which emits light of a second color, and a third sub-emission layer which emits light of a third color, wherein the first to third sub-emission layers are repeatedly stacked at least twice.

The first to third pixels may further include a color filter formed under the first electrode, respectively.

The first electrodes of the first and second pixels and the lower first electrode of the third pixel may be formed on the same layer.

The intermediate first electrode may be thinner than the lower first electrode and the upper first electrode.

The upper first electrode may have a thickness of about 300 Å to about 2000 Å.

The intermediate first electrode may have a thickness of about 50 Å to about 300 Å.

The lower and upper first electrodes may include at least one selected from among ITO, IZO and ZnO.

The intermediate first electrode may include at least one selected from among silver (Ag), aluminum (Al), gold (Au), nickel (Ni), magnesium (Mg), and an alloy of at least one of the foregoing.

The OLED display may further include a white pixel, wherein the white pixel may include a first electrode, a second electrode facing the first electrode and an emission layer sandwiched between the first and second electrodes, wherein the first electrode of the white pixel may be a single layer including a conductive oxide.

Another exemplary embodiment of the present invention provides a method for manufacturing an organic light emitting diode ("OLED") display including first to third pixels each displaying a different color, including forming a first electrode, forming an emission layer on the first electrode and forming a second electrode on the emission layer. The forming of the first electrode may include forming a first electrode of a single layer including a conductive oxide at the first and second pixels, respectively, and a first electrode including a lower first electrode including a conductive oxide, an intermediate first electrode including a semitransparent conductor and an upper first electrode including a conductive oxide at the third pixel.

In the forming of the first electrodes, the first electrodes of the first and second pixels and the lower first electrode of the third pixel may be simultaneously formed.

The forming of the first electrodes may include: stacking a first conductive oxide layer and patterning the same to form the first electrodes of the first and second pixels and the lower first electrode of the third pixel; coating a first photosensitive film on the first electrodes of the first and second pixels and on the lower first electrode of the third pixel and patterning the same to form a first photosensitive pattern having an opening exposing the lower first electrode of the third pixel; sequentially stacking a semitransparent conductive layer and a second conductive oxide layer on the first photosensitive pattern and on the lower first electrode of the third pixel; coating a second photosensitive film on the second conductive oxide layer and patterning the same to form a second photosensitive pattern positioned at the opening; and patterning the second conductive oxide layer and the semitransparent conductive layer using the second photosensitive pattern as a mask to sequentially form the intermediate first electrode and the upper first electrode on the lower first electrode of the third pixel.

The manufacturing method may further include simultaneously removing the first and second photosensitive patterns after the sequential forming of the intermediate first electrode and the upper first electrode.

The second conductive oxide layer and the semitransparent conductive layer may be simultaneously patterned.

The first pixel, the second pixel and the third pixel may be a red pixel, a blue pixel and a green pixel, respectively.

The manufacturing method may further include forming a color filter before the forming of the first electrode.

The forming of the emission layer may further include sequentially stacking a first sub-emission layer which emits light of a first color, a second sub-emission layer which emits light of a second color, and a third sub-emission layer which emits light of a third color on the entire surface of the first to third pixels.

The sequentially stacking of the first to third sub-emission layers may be repeated at least twice.

The color purity and color reproducibility can be improved by strengthening light of a narrow wavelength region and suppressing light of wavelength regions other than the narrow wavelength region at the green pixel. In addition, by adjusting the thickness of a transparent conductive layer and a transparent conductive layer at the green pixel, a spectrum having a peak of a desired wavelength range can be formed and color purity can be enhanced.

DETAILED DESCRIPTION OF THE INVENTION

Figure 1:
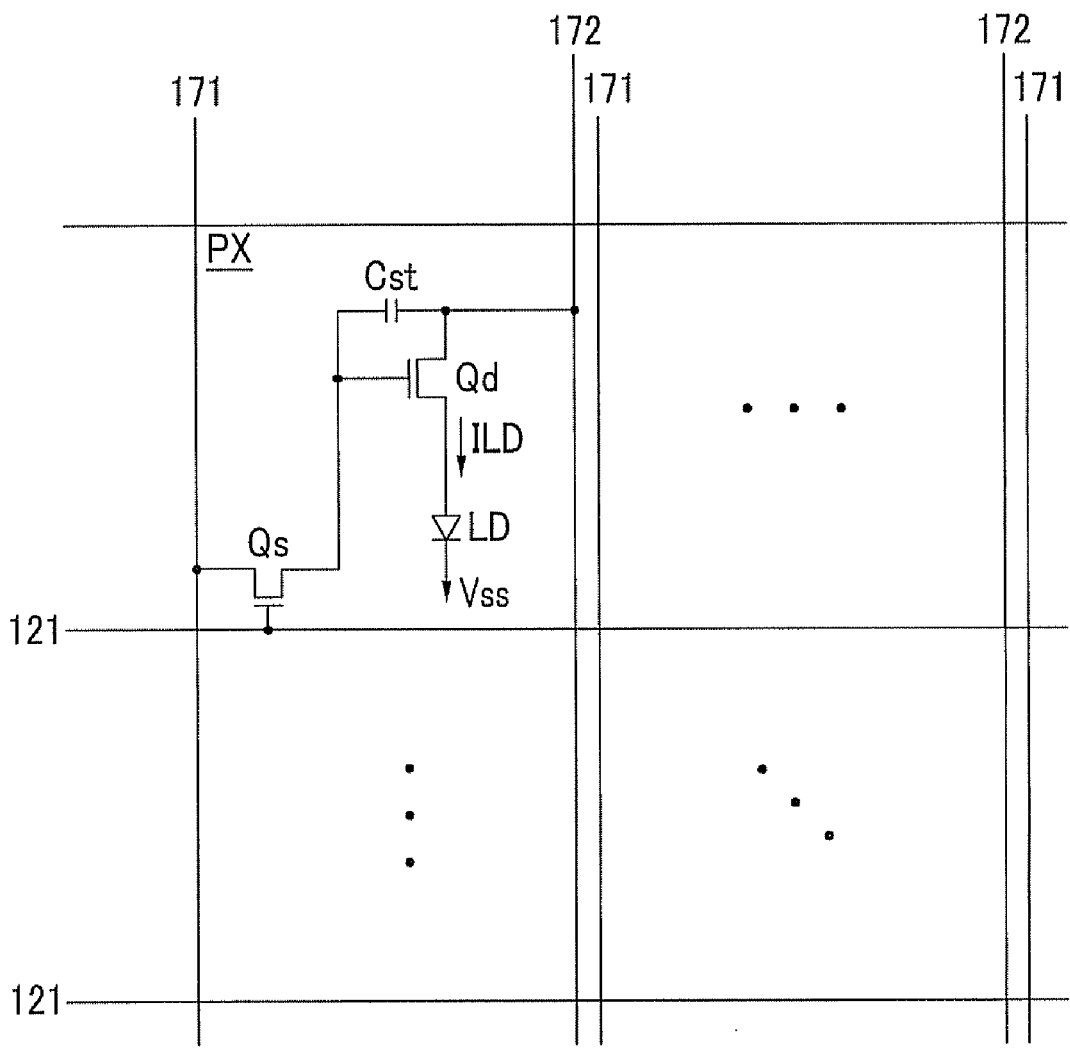
FIG. 1 is an equivalent circuit schematic diagram of an OLED display according to an exemplary embodiment of the present invention.

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

An organic light emitting diode ("OLED") display according to an exemplary embodiment of the present invention will now be described with reference to FIG. 1.

FIG. 1 is an equivalent circuit schematic diagram of the OLED display according to an exemplary embodiment of the present invention. The OLED display includes a plurality of signal lines 121, 171 and 172 and a plurality of pixels (PX) connected with the signal lines 121, 171 and 172, and the plurality of pixels (PX) are arranged substantially in a matrix.

The signal lines include a plurality of gate lines 121 which transmit gate signals (or scan signals), a plurality of data lines 171 which transmit data signals and a plurality of driving voltage lines 172 which transmit driving voltages. The gate lines 121 extend substantially in a row direction and are substantially parallel to each other, and the data lines 171 and the driving voltage lines 172 extend substantially in a column direction and are substantially parallel to each other, as illustrated in FIG. 1.

Each pixel (PX) includes a switching thin film transistor ("TFT") Qs, a driving TFT Qd, a storage capacitor Cst and an organic light emitting diode ("OLED") LD.

The switching TFT Qs includes a control terminal, an input terminal and an output terminal. The control terminal is connected with the gate line 121, the input terminal is connected with the data line 171 and the output terminal is connected with the driving TFT Qd and the storage capacitor Cst. In response to a scan signal applied to the gate line 121, the switching TFT Qs transmits a data signal, which is applied to the data line, to the driving TFT Qd.

The driving TFT Qd also includes a control terminal, an input terminal and an output terminal. The control terminal is connected with the output terminal of the switching TFT Qs, the input terminal is connected with the driving voltage line 172, and the output terminal is connected with the OLED LD. The driving TFT Qd provides an output current $I_{LD}$ having a magnitude which varies depending on the voltage between the control terminal and the output terminal of the driving TFT Qd.

The capacitor Cst is connected between the control terminal and the input terminal of the driving transistor Qd. The capacitor Cst charges a data signal applied to the control terminal of the driving TFT Qd and maintains the data signal even after the switching transistor Qs is turned off.

The OLED LD includes an anode connected with the output terminal of the driving TFT Qd and a cathode connected with a common voltage Vss. The OLED LD emit light with intensity which changes according to the output current $I_{LD}$ of the driving TFT Qd, to display an image.

The switching TFT Qs and the driving TFT Qd are n-channel electric field effect transistors ("FETs"). In alternative embodiments, at least one of the switching TFT Qs and the driving TFT Qd may be a p-channel FET. The connection relationship among the TFTs Qs and Qd, the capacitor Cst, and the OLED LD may change.

The OLED display as illustrated in FIG. 1 will be described with reference to FIGS. 2 and 3.

Figure 2:
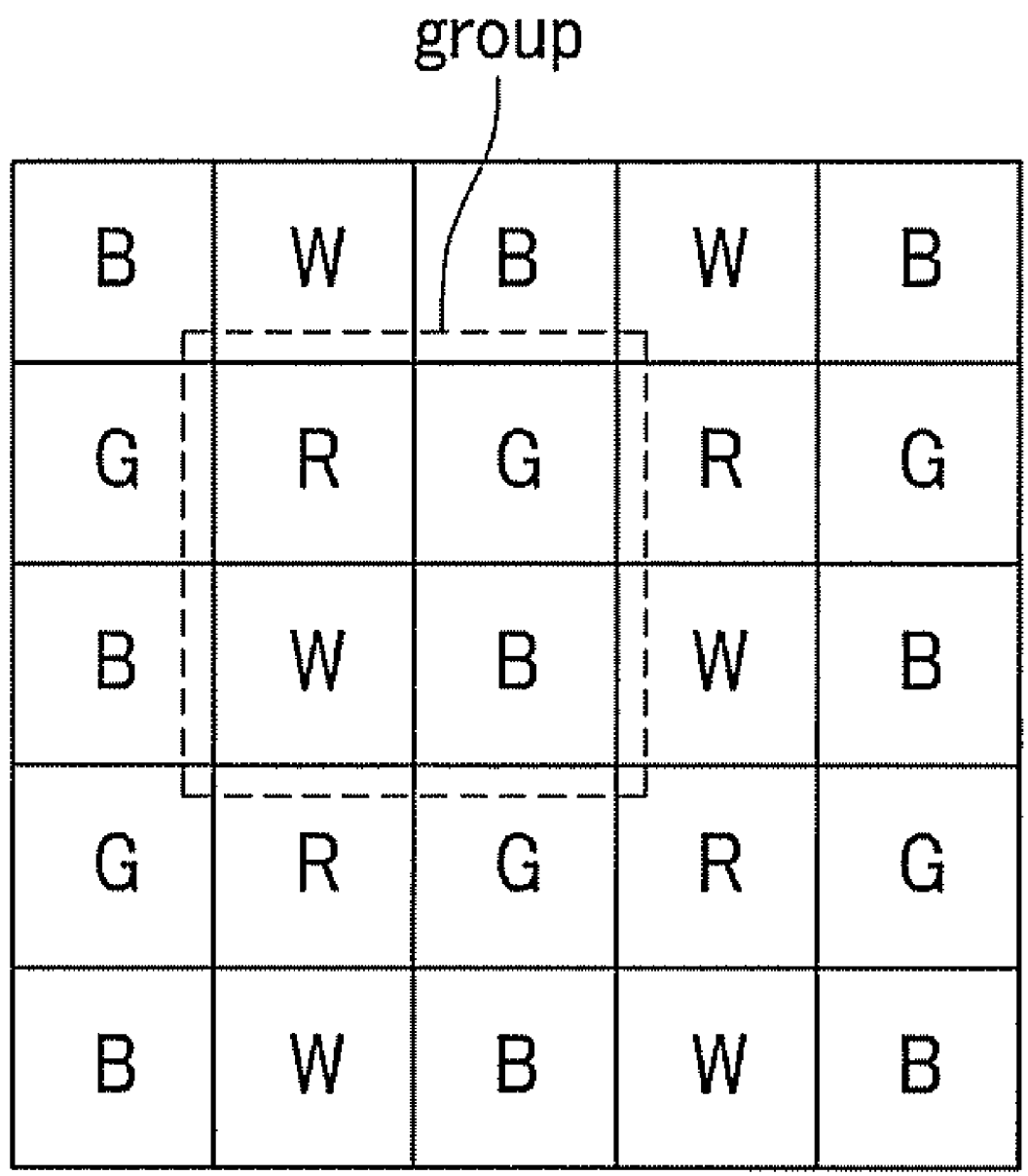
FIG. 2 is a top plan view showing disposition of a plurality of pixels in the OLED display according to an exemplary embodiment of the present invention.

FIG. 2 is a top plan view showing disposition of a plurality of pixels in the OLED display according to an exemplary embodiment of the present invention. FIG. 3 is an enlarged top plan view showing a single pixel group divided into two sub-pixel groups in the OLED display in FIG. 2.

Figure 3:
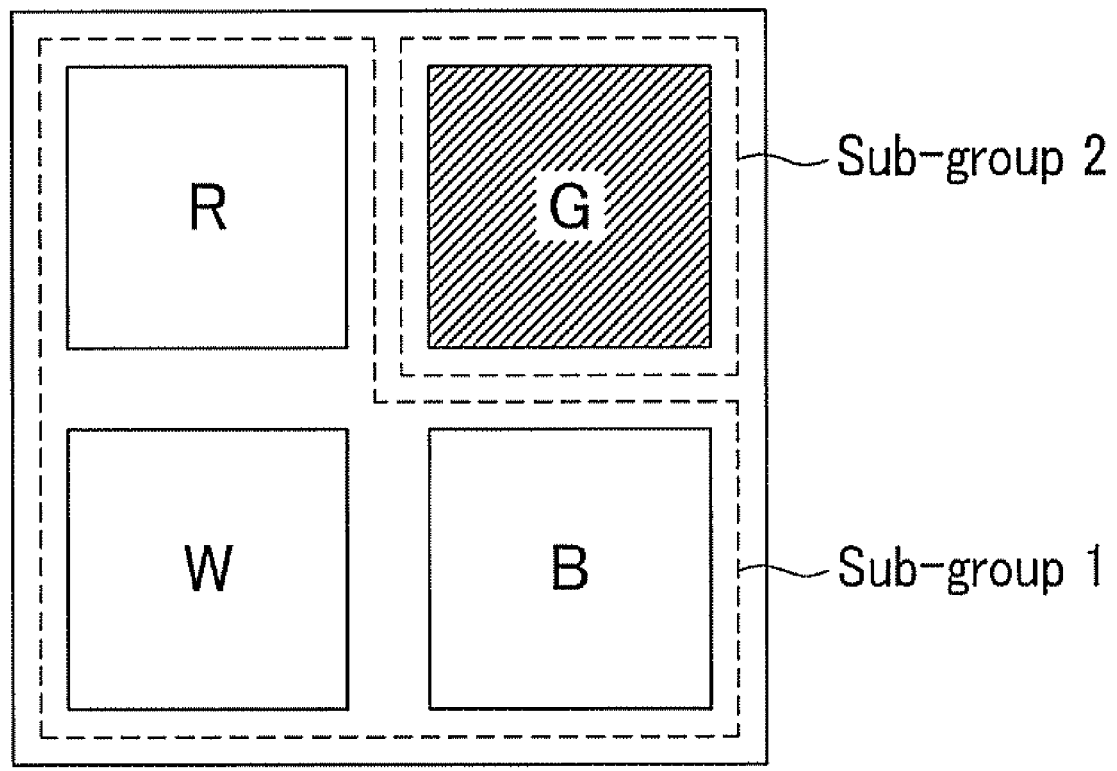
FIG. 3 is an enlarged top plan view showing a single pixel group divided into two sub-pixel groups in the OLED display in FIG. 2.

With reference to FIGS. 2 and 3, the OLED display according an exemplary embodiment of the present invention includes red pixels (R) which display red color, green pixels (G) which display green color, blue pixels (B) that display blue color, and white pixels (W). The red pixel (R), the green pixel (G) and the blue pixel (B) are primary pixels for expressing full colors, and the luminance thereof can be enhanced by including the white pixel (W).

The four pixels including the red pixel (R), the green pixel (G), the blue pixel (B) and the white pixel (W) may be grouped and repeated in rows or columns. The disposition of the pixels may vary from that illustrated in FIGS. 2 and 3.

Of the pixels, the red pixel (R), the blue pixel (B), and the white pixel (W) form a first sub-pixel group, and the green pixel (G) forms a second sub-pixel group. Unlike the first sub-pixel group, the second sub-pixel group includes a mirocavity structure.

A more detailed structure of the OLED display as shown in FIGS. 2 and 3 will now be described with reference to FIG. 4.

Figure 4:
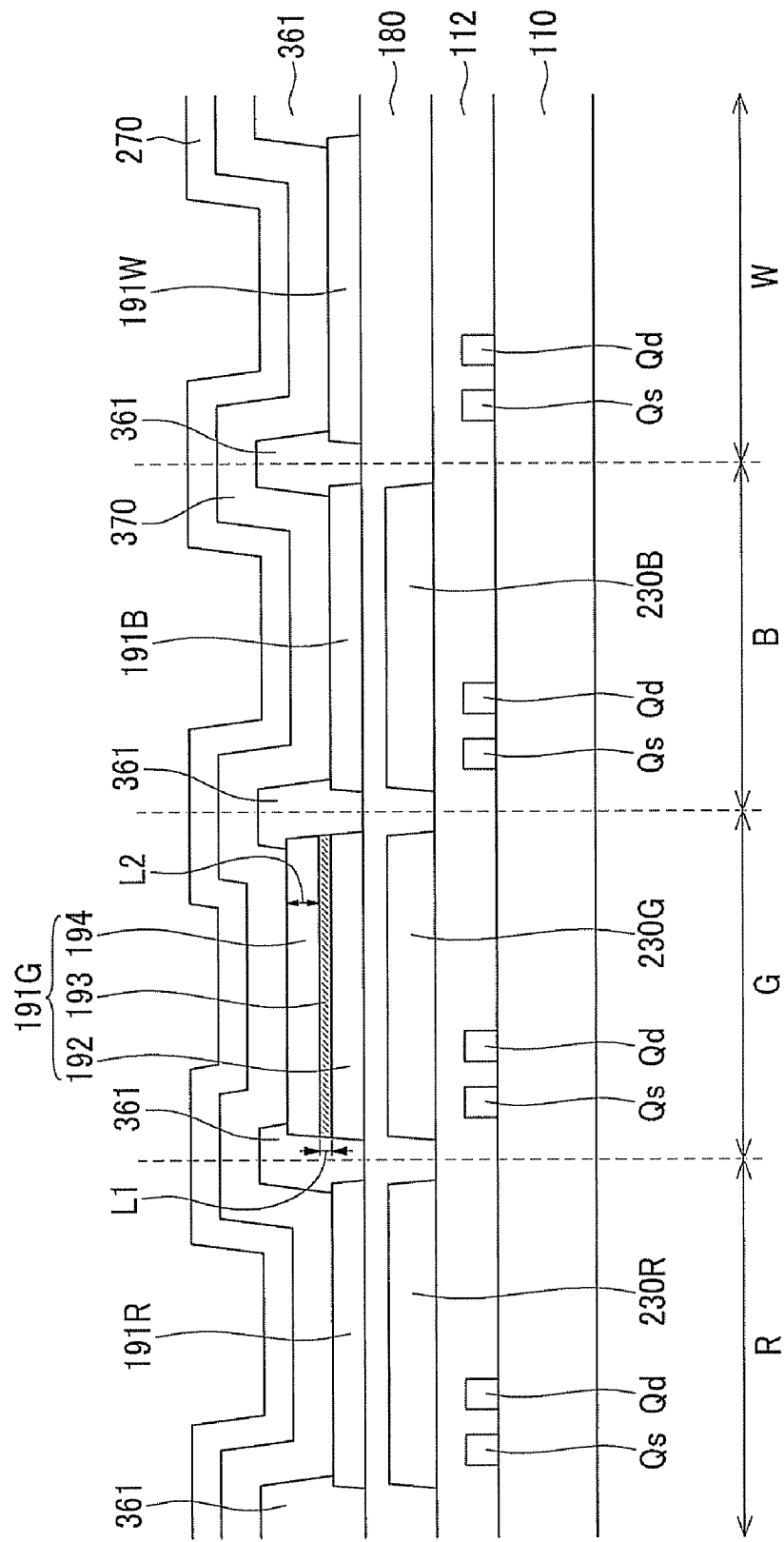
FIG. 4 is a cross-sectional view showing the OLED display according to an exemplary embodiment of the present invention.

FIG. 4 is a cross-sectional view showing the OLED display according to an exemplary embodiment of the present invention.

A plurality of TFT arrays are arranged on an insulating substrate 110. The TFT array includes the switching TFT Qs and the driving TFT Qd which are disposed at each pixel (PX). The switching TFT Qs and the driving TFT Qd are electrically connected to each other as described with respect to FIG. 1.

A lower insulating layer 112 is formed on the TFT arrays. The lower insulating layer 112 includes a plurality of contact holes (not shown) which expose portions of the switching TFTs Qs and the driving TFTs Qd.

A red filter 230R, a green filter 230G and a blue filter 230B are formed on the lower insulating layer 112, at the red pixel (R), the green pixel (G) and the blue pixel (B), respectively. No color filter is formed or a transparent filter (not shown) may be formed at the white pixel (W). The color filters 230R, 230G and 230B may be disposed according to a color filter on array ("CoA") method.

An upper insulating layer 180 is formed on the color filters 230R, 230G and 230B and on the lower insulating layer 112. The upper insulating layer 180 includes a plurality of contact holes (not shown).

Pixel electrodes 191R, 191G, 191B and 191W are formed on the upper insulating layer 180. The pixel electrodes 191R, 191G, 191B and 191W are electrically connected with the driving TFTs Qd via contact holes (not shown), and may serve as anodes.

The pixel electrodes 191R, 191B and 191W at the red pixel (R), the blue pixel (B) and the white pixel (W) are single layers made of a transparent conductor, respectively. Here, the transparent conductor may be a conductive oxide such as indium tin oxide ("ITO"), indium zinc oxide ("IZO"), zinc oxide ("ZnO"), etc. The pixel electrodes 191R, 191B and 191W may have a thickness of about 600 Å to about 1500 Å, respectively.

The pixel electrode 191G at the green pixel (G) is a triple-layer including a lower transparent conductive layer 192, a semitransparent conductive layer 193, and an upper transparent conductive layer 194. Here, the lower transparent conductive layer 192 and the upper transparent conductive layer 194 may be made of a conductive oxide such as ITO, IZO, ZnO, etc. The semitransparent conductive layer 193 may be made of a material having such properties which allow a portion of light to transmit therethrough and a portion of light to be reflected therefrom, and may be made of silver (Ag), aluminum (Al), gold (Au), nickel (Ni), magnesium (Mg), including alloys of the foregoing, etc., each with a thin thickness.

The lower transparent conductive layer 192 may be formed on the same layer on which the pixel electrodes 191R, 191B and 191W are formed, respectively, at the red pixel (R), the blue pixel (B) and the white pixel (W), and may have a thickness of about 600 Å to about 1500 Å. The lower transparent conductive layer 192 improves adhesion between the semitransparent conductive layer 193 and the upper insulating layer 180. In particular, because the upper insulating layer 180 includes the contact holes (not shown), if the semitransparent conductive layer 193 is directly formed on the contact holes, adhesion would deteriorate to possibly result in a disconnection between the TFTs and the pixel electrodes. The lower transparent conductive layer 192 may serve to avoid such a deficiency of adhesion.

The thickness L1 of the semitransparent conductive layer 193 is about 50 Å to about 300 Å, and the thickness L2 of the upper transparent conductive layer 194 is about 300 Å to about 2000 Å. The color purity and color reproducibility of the green pixel (G) can be improved by adjusting the thicknesses of L1 and L2. This will be described later.

A plurality of insulating members 361 which define each pixel are formed on and between the pixel electrodes 191R, 191B, 191G and 191W, and an organic light emitting member is formed on the plurality of insulation members 361 and on the pixel electrodes 191R, 191B, 191G and 191W.

The organic light emitting member may include an organic emission layer 370, and an auxiliary layer (not shown) which may improve emission efficiency of the organic emission layer 370.

The organic emission layer 370 may include a plurality of sub-emission layers (not shown) formed by sequentially stacking materials, each of which uniquely manifests red, green or blue light, and may emit white light by combining the colors of the plurality of sub-emission layers. The sub-emission layers may be formed to be horizontal, without being limited to being formed to be vertical, and various colors may be combined so long as they can manifest white light, without being limited to the red, green and blue colors.

The emission layer 370 may have such a structure in which the plurality of sub-emission layers are stacked repeatedly several times. That is, for example, a red sub-emission layer, a blue sub-emission layer and a green sub-emission layer may be sequentially stacked, on which a red sub-emission layer, a blue sub-emission layer and a green sub-emission layer are repeatedly stacked again.

The auxiliary layer may be one or more selected from among an electron transport layer, a hole transport layer, an electron injecting layer and a hole injecting layer.

A common electrode 270 is formed on the organic light emitting member. The common electrode 270 may be made of a metal having a high reflection factor, and serves as a cathode. The common electrode 270 is formed on the entire surface of the substrate 110, and makes a pair of electrodes with each of the pixel electrodes 191R, 191B, 191G and 191W serving as anodes to provide current to the organic emission layer 370.

In the exemplary embodiment of the present invention, the green pixel (G) includes a microcavity structure, while the red pixel (R), the blue pixel (B) and the white pixel (W) do not include such a microcavity structure.

The microcavity structure refers to a structure in which light is repeatedly reflected between a reflective layer and a semitransparent layer which are spaced apart by an optical path length to thus amplify light of a particular wavelength by constructive interference. Here, the common electrode 270 serves as the reflective layer, and the semitransparent conductive layer 193 serves as the semitransparent layer.

The common electrode 270 considerably modifies the illumination characteristics of light emitted from the organic emission layer 370. Of the modified light, light near the wavelength corresponding to a resonance wavelength of the microcavity is strengthened by the semitransparent conductive layer 193, and light of the other wavelengths is suppressed.

The microcavity will now be described with reference to FIGS. 15A to 18 along with FIG. 4.

Figure 15A:
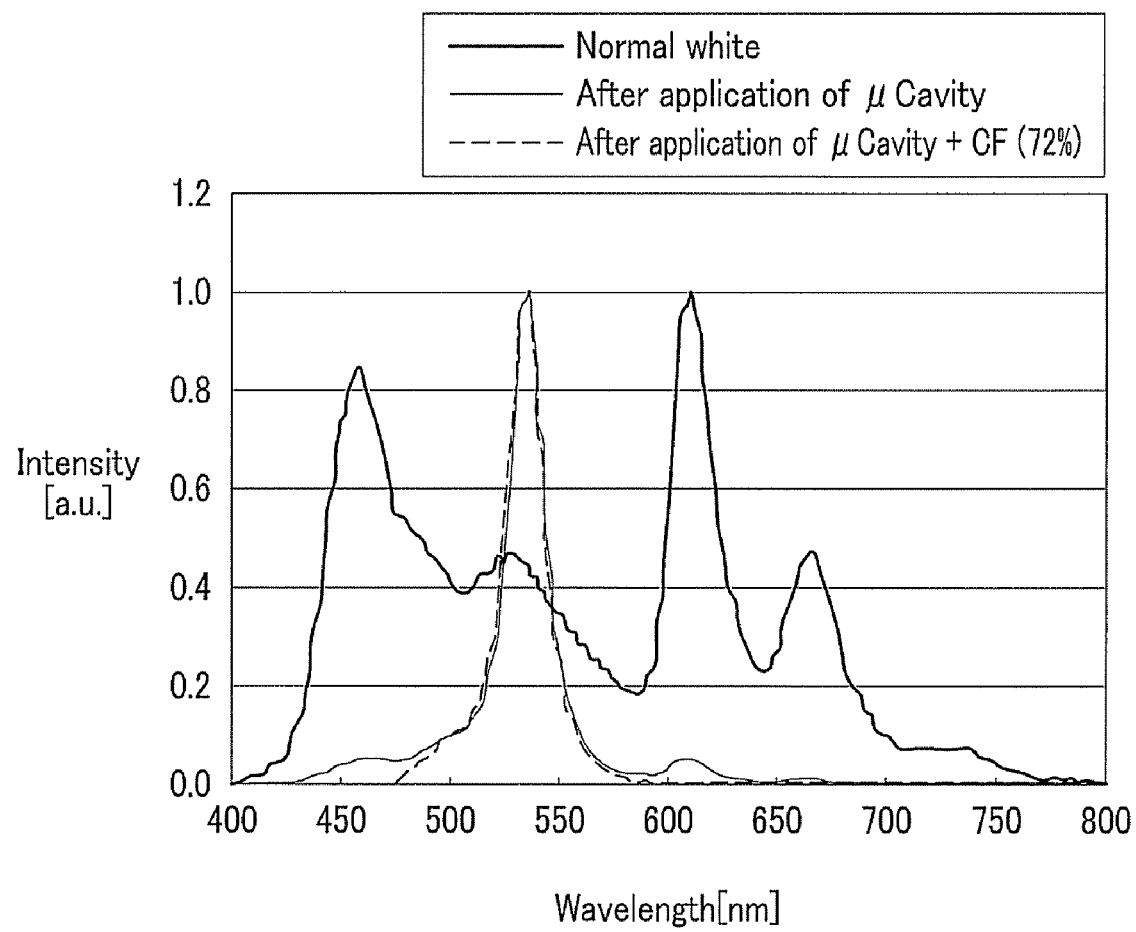
FIG. 15A is a graph showing an emission spectrum of the OLED display according to an exemplary embodiment of the present invention.
Figure 15B:
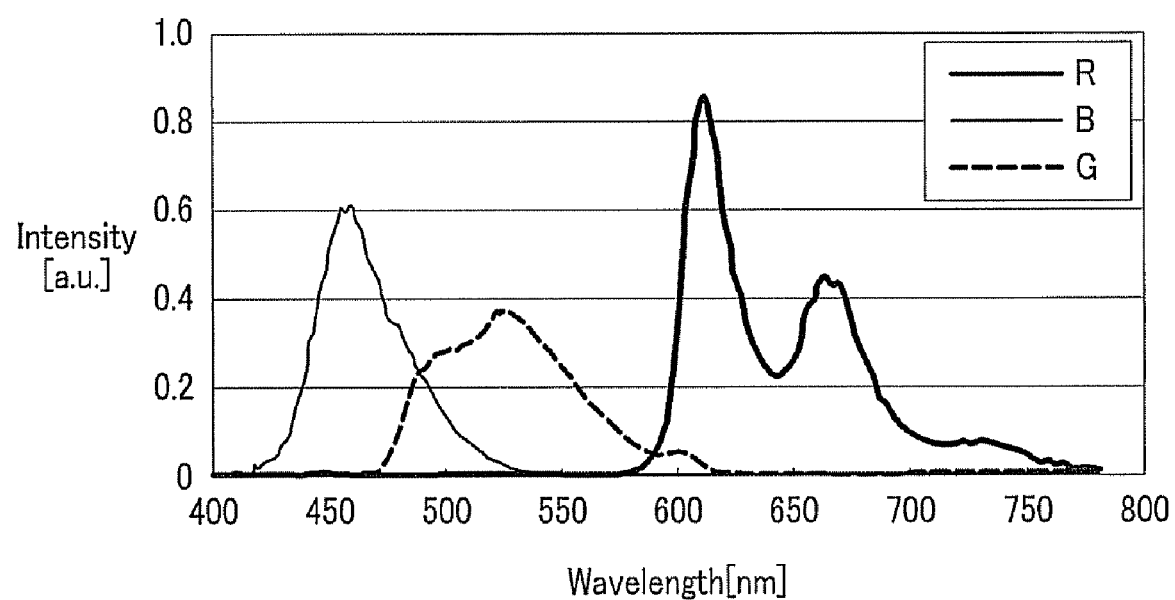
FIG. 15B is a graph showing an emission spectrum after white-emitted light passes through a color filter of the OLED display according to an exemplary embodiment of the present invention.
Figure 15C:
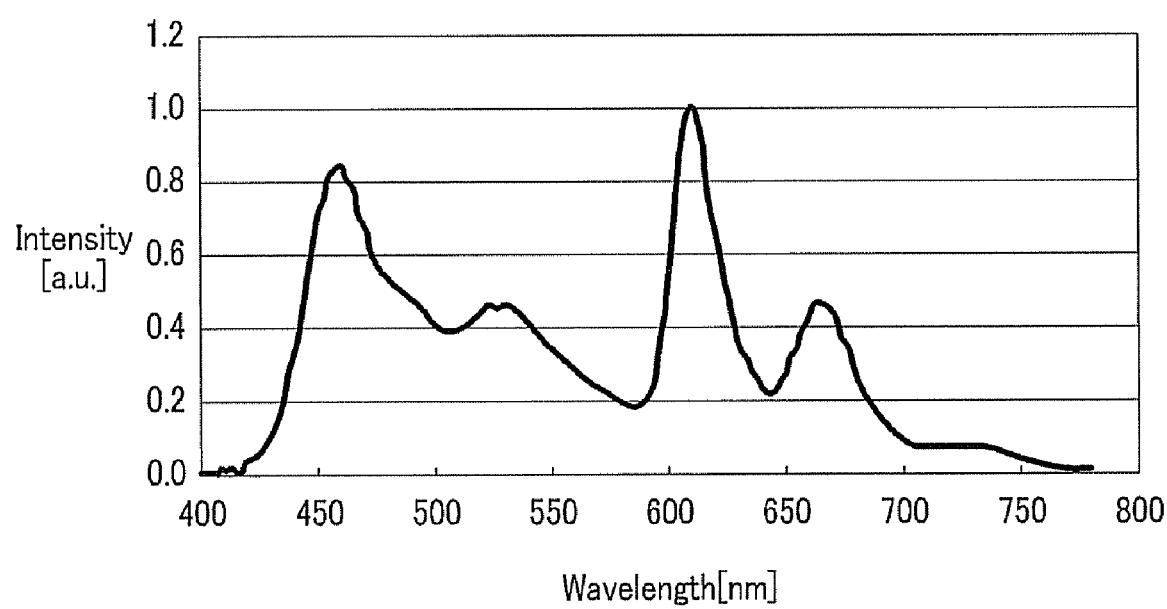
FIG. 15C is a graph showing an emission spectrum of light that is white-emitted from an emission layer of the OLED display according to an exemplary embodiment of the present invention.
Figure 16:
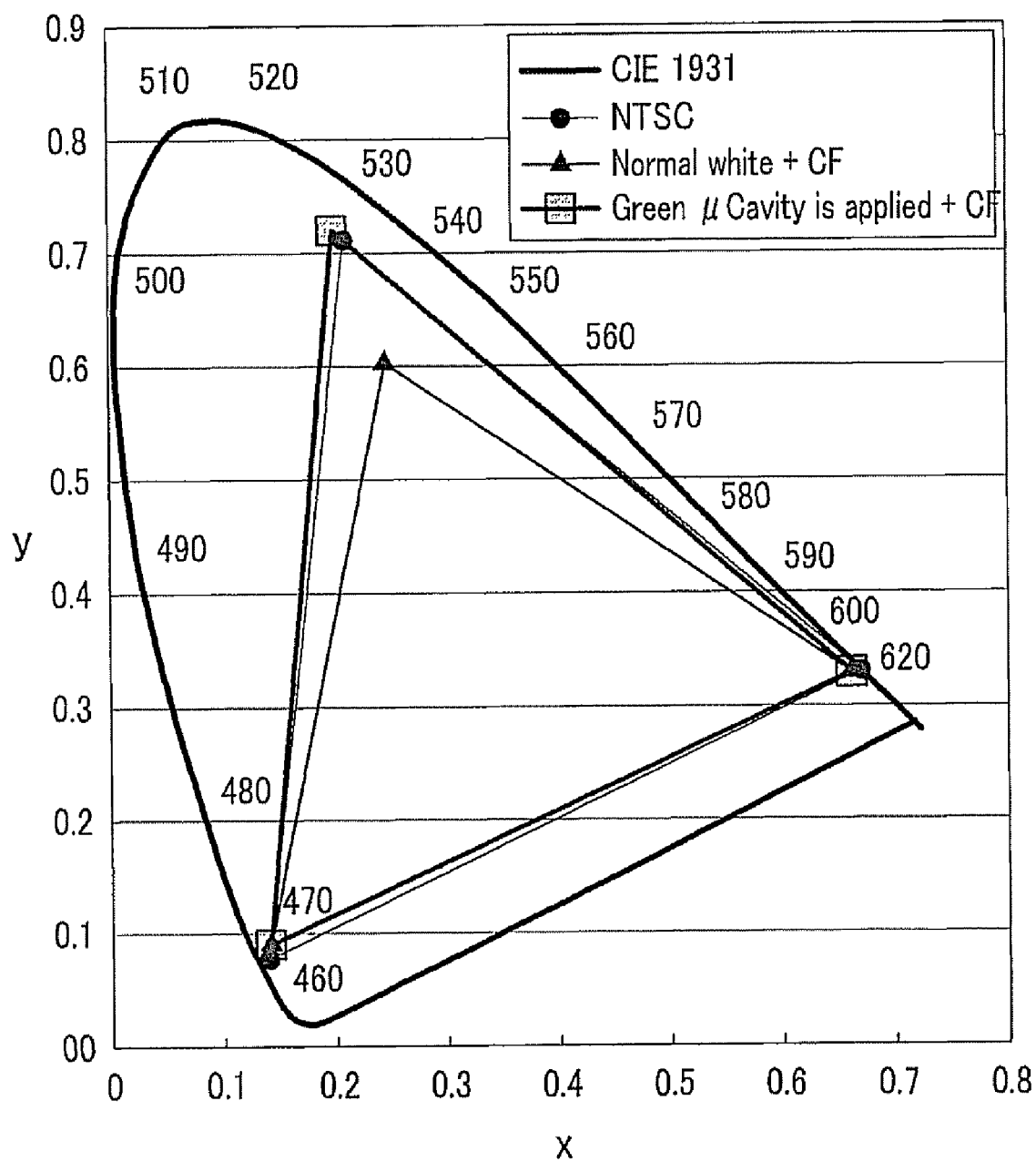
FIG. 16 is a graph of color coordinates showing color reproducibility of the OLED display according to an exemplary embodiment of the present invention.
Figure 17:
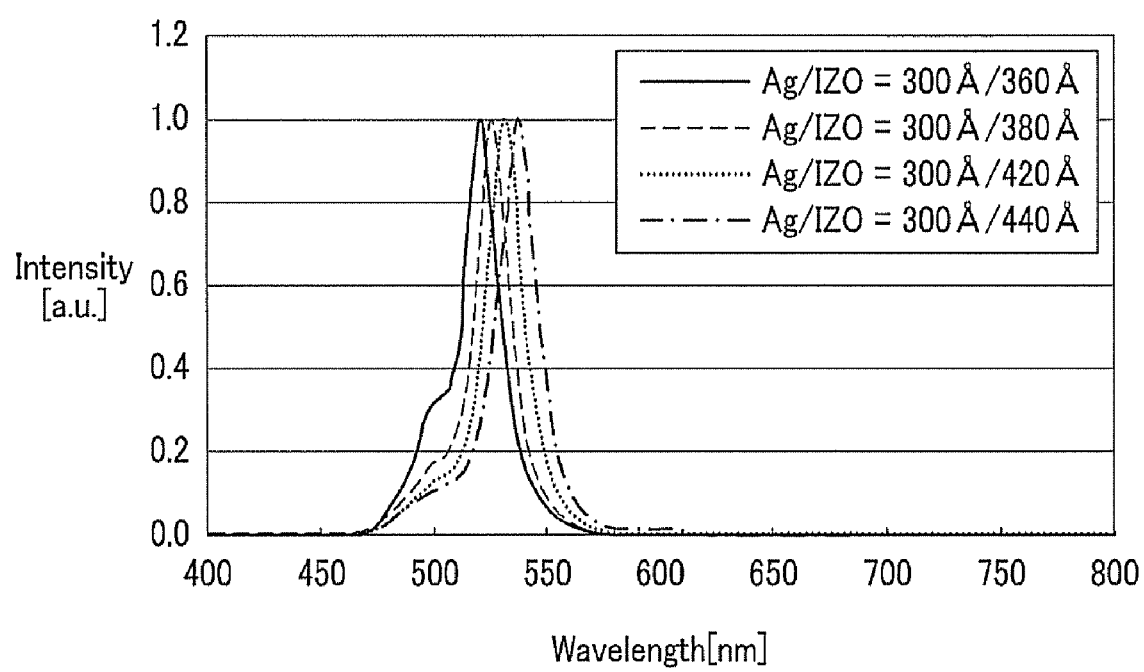
FIGS. 17 and 18 are graphs showing changes in positions of peak wavelengths when the thickness of an upper transparent conductive layer is changed in the OLED display according to an exemplary embodiment of the present invention.
Figure 18:
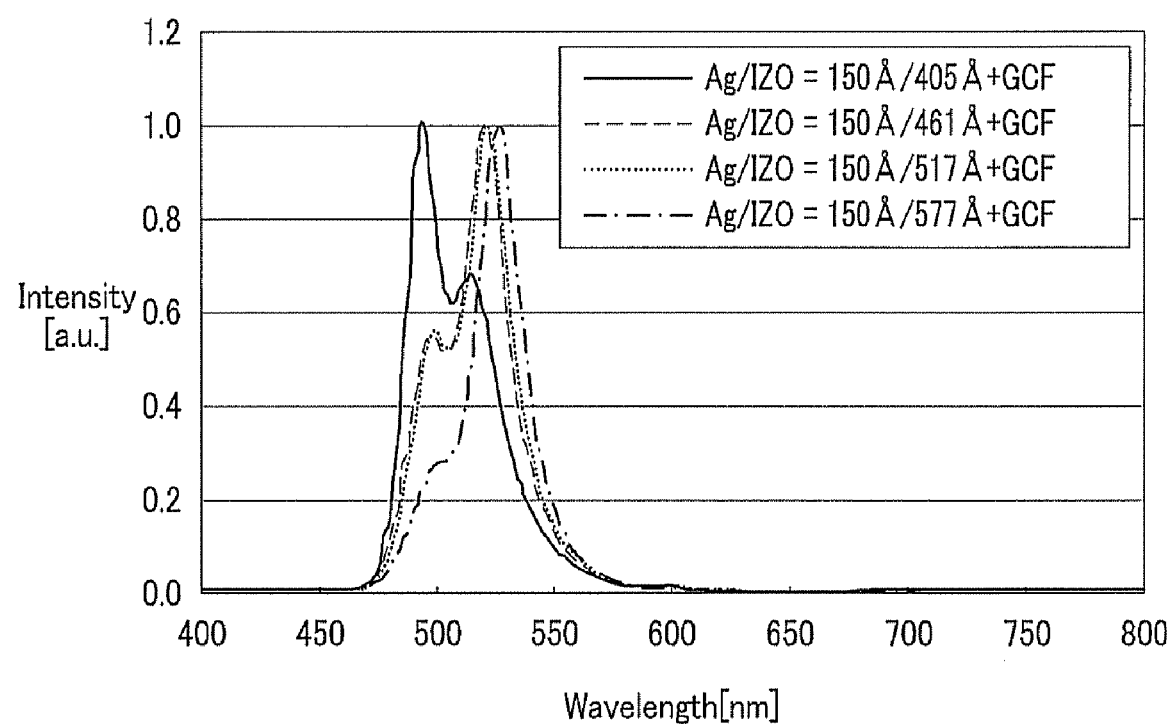

FIG. 15A is a graph showing an emission spectrum of the OLED display according to an exemplary embodiment of the present invention. FIG. 15B is a graph showing an emission spectrum after white-emitted light passes through a color filter of the OLED display. FIG. 15C is a graph showing an emission spectrum of light white-emitted from an emission layer 370 of the OLED display. FIG. 16 is a graph of color coordinates showing color reproducibility of the OLED display according to an exemplary embodiment of the present invention. FIGS. 17 and 18 are graphs showing changes in positions of peak wavelengths when the thickness of an upper transparent conductive layer 194 is changed in the OLED display according to an exemplary embodiment of the present invention.

First, with reference to FIG. 15C, white light emitted from the emission layer 370 exhibits emission spectrums having peaks near about 460 nm (blue region), near about 530 nm (green region), and near about 610 nm (red region). Of them, the spectrum of the green region extends in a wide wavelength range and overlaps with the spectrum of a long wavelength of the blue region, so their boundary is not clear.

With reference to FIG. 15B, when such white light passes through a color filter, the green emission spectrum transmits through the emission spectrum of the long wavelength of blue color, so color purity of green color is drastically degraded.

In the exemplary embodiment of the present invention, the microcavity structure is included in the green pixel (G), whereby light of a particular wavelength range of the green wavelength region can be amplified and light of the remaining wavelengths can be suppressed to thus form an emission spectrum of a narrow wavelength range.

With reference to FIG. 15A, it is noted that, when the green pixel (G) has the microcavity structure, white color-emitted light can be emitted with a high intensity at a narrow wavelength region of about 520 nm to about 550 nm. The fact that green light has such a narrow wavelength region means that the color purity and color reproducibility have been improved, and the high intensity means that light efficiency has been improved.

The green emission spectrum of such a narrow wavelength range is obtained as light of the narrow wavelength region of about 520 nm to about 550 nm and light of the other wavelength regions is suppressed, owing to the microcavity structure between the semitransparent conductive layer 193 at the green pixel (G) and the common electrode 270. Because such green emission spectrum does not overlap with the wavelength of the blue emission spectrum, the color purity and color reproducibility of the green color can be improved.

With reference to FIG. 16, assuming that an NTSC region has 100% color reproducibility, it can be noted that the structure having the microcavities only at the green pixel (G) according to the exemplary embodiment of the present invention has high color reproducibility of nearly 100%. This means that the color reproducibility is remarkably improved compared with the case where a structure without microcavities has about 72% color reproducibility.

A wavelength range of light strengthened in the microcavity structure may be determined depending on the optical path length. The optical path length may be determined by the thicknesses of the emission layer 370, the semitransparent conductive layer 193, and the upper transparent conductive layer 194. Because the emission layer 370 is formed on the entire surface under the same deposition conditions, it can be assumed that the thickness of the emission layer 370 is uniform. Thus, the optical path length can be adjusted with the thickness of the semitransparent conductive layer 193 and the upper transparent conductive layer 194.

In further detail, the thickness of the upper transparent conductive layer 194 determines a peak position in the emission spectrum.

With reference to FIG. 17, in the structure in which a single white emission layer formed by sequentially stacking the red sub-emission layer, the green sub-emission layer and the blue sub-emission layer is used as the emission layer 370, when the thickness of the semitransparent conductive layer 193 made of silver (Ag) was fixed as about 300 Å while the thickness of the upper transparent conductive layer 194 was changed to be about 360 Å, 380 Å, 420 Å and 440 Å, respectively, it is noted that the position of the peak wavelength of the green emission region moved toward the long wavelength.

Likewise, with reference to FIG. 18, in the structure in which a dual-white emission layer formed by stacking the red sub-emission layer, the green sub-emission layer and the blue sub-emission layer twice is used as the emission layer 370, when the thickness of the semitransparent conductive layer 193 made of silver (Ag) was fixed as about 150 Å while the thickness of the upper transparent conductive layer 194 was changed to be about 405 Å, 461 Å, 517 Å, and 577 Å, respectively, it is noted that the position of the peak wavelength of the green emission region moved toward the long wavelength.

In this manner, it can be noted that the peak wavelength of the emission spectrum is determined by adjusting the thickness of the upper transparent conductive layer 194. In the exemplary embodiment of the present invention, the peak can be formed at the green wavelength region when the upper transparent conductive layer 194 has the thickness of about 300 Å to 2000 Å. In particular, when the upper transparent conductive layer 194 has a thickness of about 450 Å to 700 Å, the peak wavelength can be shown at an optimum position of about 520 nm to about 550 nm.

The thickness of the semitransparent conductive layer 193 determines the width of the emission spectrum. The width of the emission spectrum determines how wide the range of wavelength of the emission spectrum appears. When the emission spectrum extends with a wide width, the color purity and color reproducibility are degraded, whereas when the emission spectrum appears sharply with a narrow width, high color purity and high color reproducibility can be obtained. In the exemplary embodiment of the present invention, if the semitransparent conductive layer 193 has a thickness of about 50 Å to about 300 Å, a sharp green spectrum with a narrow width can be obtained.

In the OLED display using the white emission layer and the color filters according to the exemplary embodiment of the present invention, because the green pixel (G) has the microcavity structure, light of the narrow wavelength can be strengthened while light of the other wavelength regions can be suppressed, and thus the color purity and color reproducibility can be improved. In addition, by adjusting the thickness of the semitransparent conductive layer and the transparent conductive layer at the green pixel, the spectrum having a peak of a desired wavelength range can be obtained and the color purity can be enhanced.

A method for manufacturing the OLED display in FIG. 4 will now be described with reference to FIGS. 5 to 14.

FIGS. 5 to 14 are cross-sectional views sequentially showing a method for manufacturing the OLED display in FIG. 4 according to an exemplary embodiment of the present invention.

Here, only the red pixel (R) and the green pixel (G) are shown for the sake of clarity, but as described above, the red pixel (R), the green blue pixel (B) and the white pixel (W) belong to the first sub-group which does not have the microcavity structure, so the blue pixel (B) and the white pixel (W) can be formed in the same manner as that of the red pixel (R).

Figure 5:
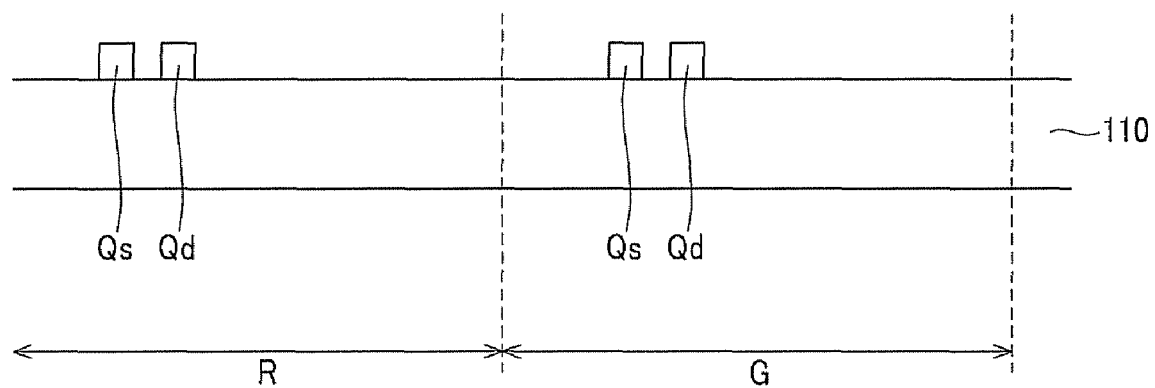
FIGS. 5 to 14 are cross-sectional views sequentially showing a method for manufacturing the OLED display in FIG. 4 according to an exemplary embodiment of the present invention.

As shown in FIG. 5, a plurality of switching TFTs Qs and a plurality of driving TFTs Qd are formed on the insulating substrate 110. Here, the forming of the switching TFTs Qs and the driving TFTs Qd includes stacking and patterning a conductive layer, an insulating layer and a semiconductor layer.

Figure 6:
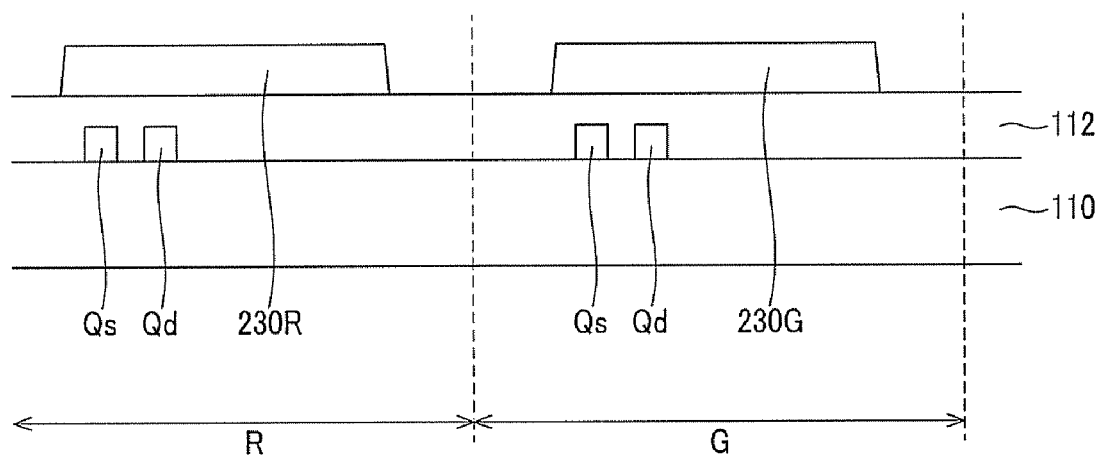

Next, as shown in FIG. 6, the lower insulating layer 112 is formed on the switching TFTs Qs, the driving TFTs Qd and the substrate 110, and then patterned to form a plurality of contact holes (not shown).

Then, as shown in FIG. 6, the color filters 230R and 230G are formed on the lower insulating layer 112.

Thereafter, the upper insulating layer 180 is formed on the lower insulating layer 112 and on the color filters 230R and 230G. The upper insulating layer 180 is then patterned to form a plurality of contact holes (not shown).

Figure 7:
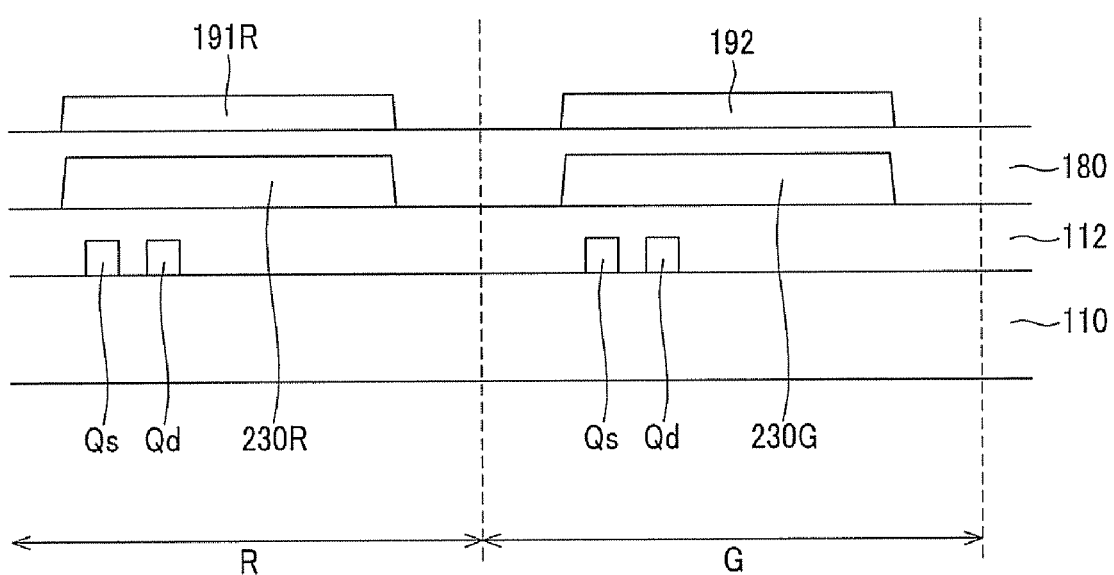

Subsequently, as shown in FIG. 7, a transparent conductive layer is deposited on the upper insulating layer 180, on which a photolithography process is performed to form the pixel electrode 191R at the red pixel (R) and the lower transparent conductive layer 192 at the green pixel (G).

Figure 8:
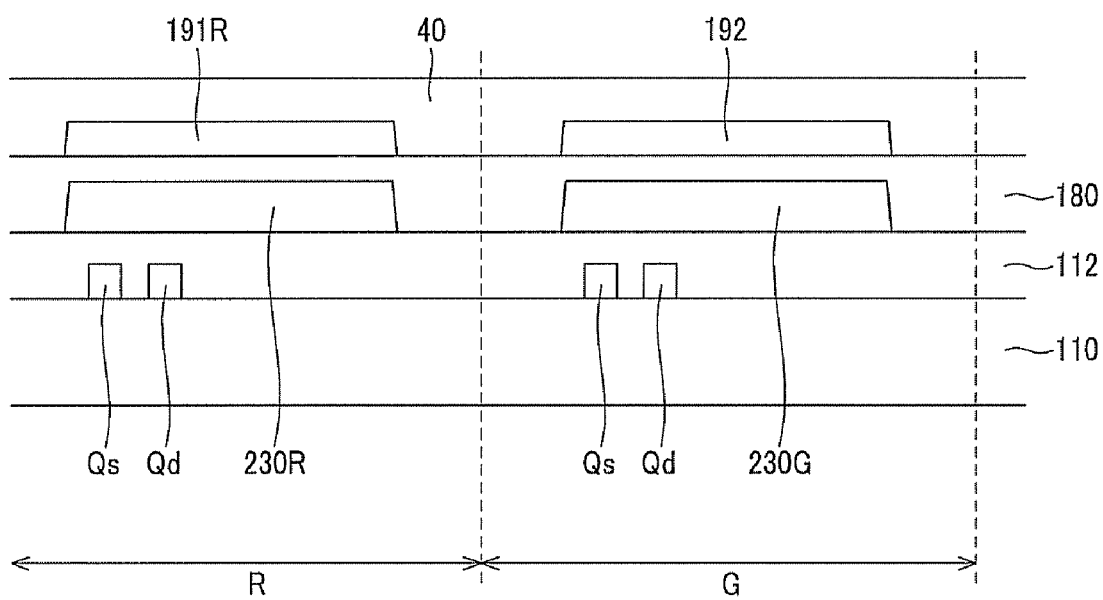

As shown in FIG. 8, a first photosensitive film 40 is then coated on the entire surface of the substrate including the pixel electrode 191R, the lower transparent conductive layer 192 and the upper insulating layer 180.

Figure 9:
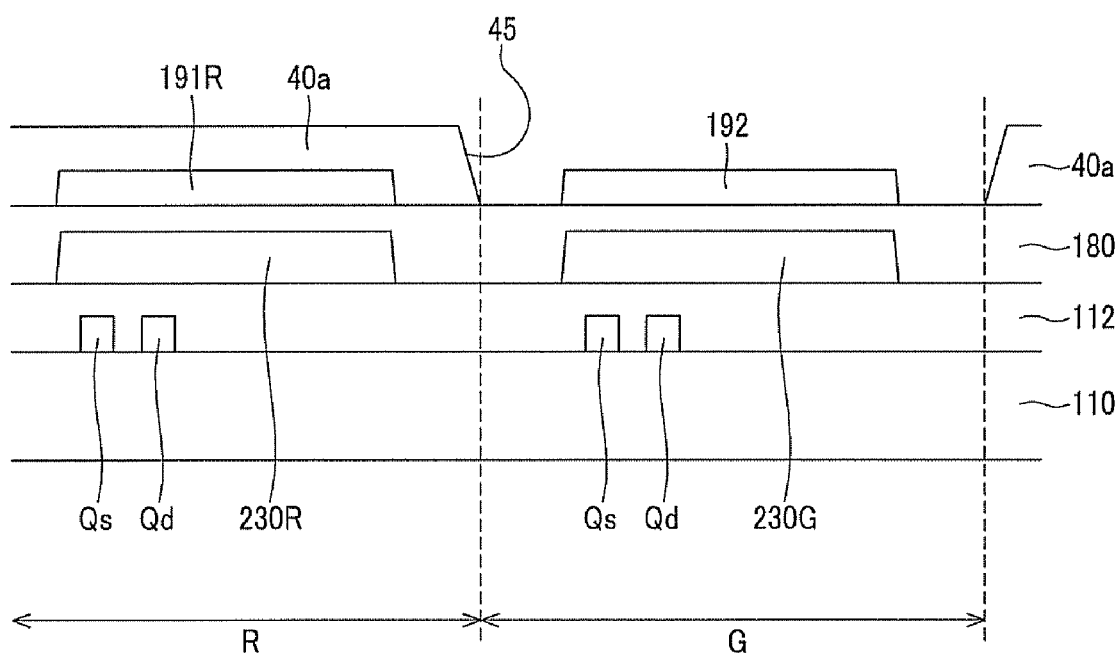

And, as shown in FIG. 9, the first photosensitive film 40 is patterned to form a first photosensitive pattern 40a. The first photosensitive pattern 40a includes a plurality of openings 45 exposing a portion of the green pixel (G) and the lower transparent conductive layer 192.

Figure 10:
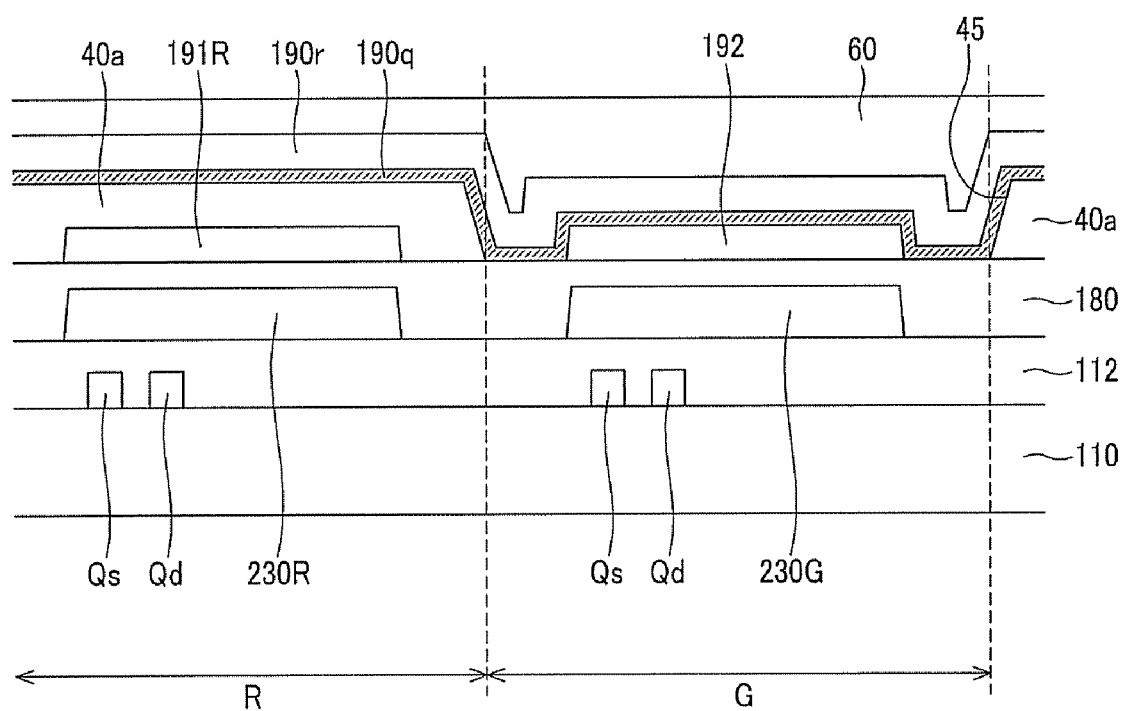

As shown in FIG. 10, a semitransparent conductive layer 190q and an upper transparent conductive layer 190r are sequentially stacked on the entire surface of the substrate including the first photosensitive pattern 40a and the lower transparent conductive layer 192, on which a second photosensitive film 60 is then coated.

Figure 11:
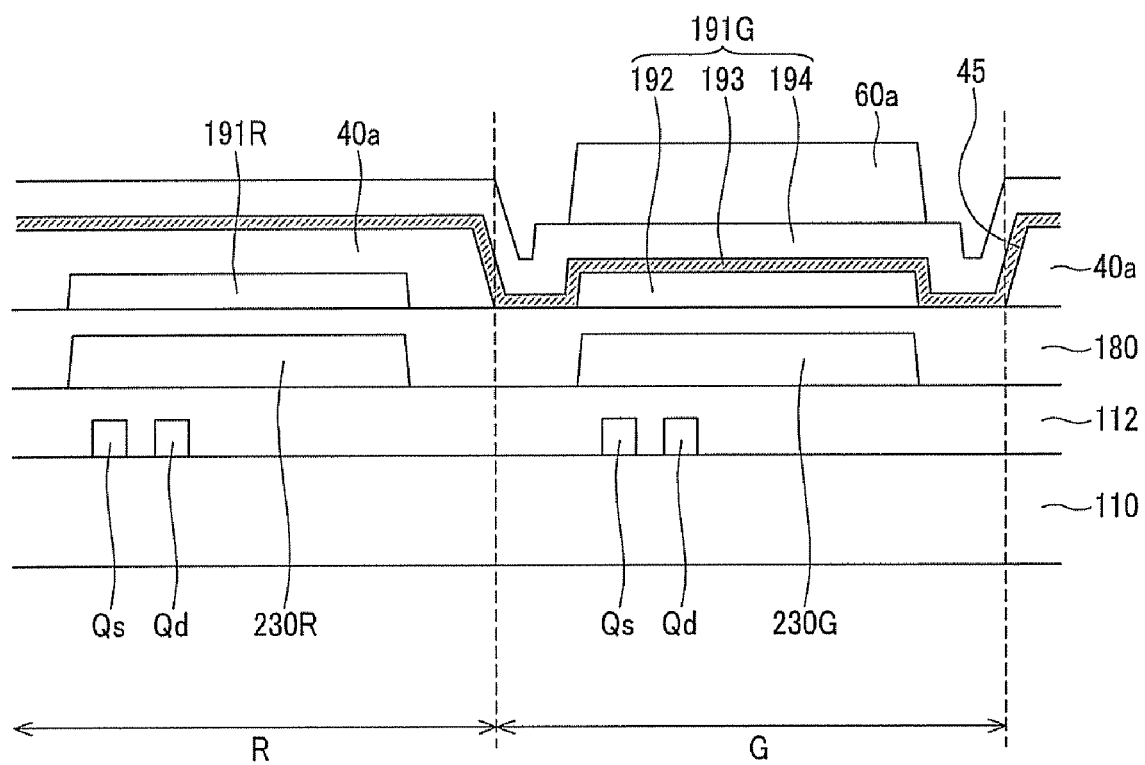

Thereafter, as shown in FIG. 11, the second photosensitive film 60 is patterned to form a second photosensitive pattern 60a at the opening 45.

Figure 12:
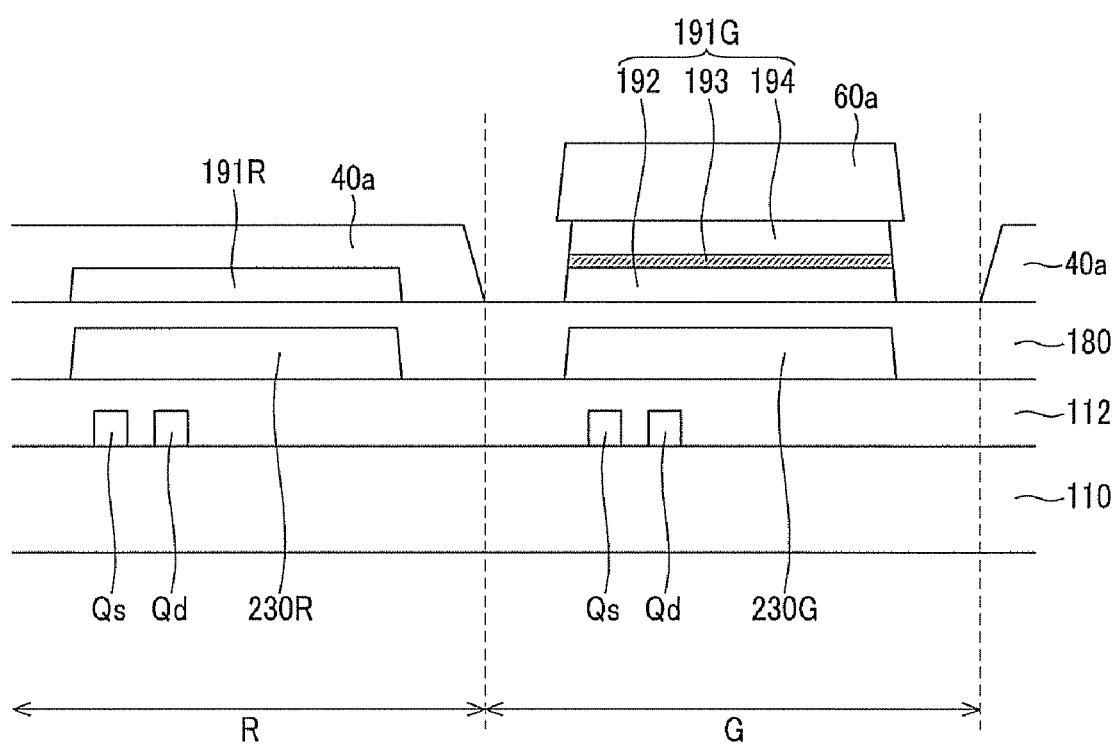

And then, as shown in FIG. 12, the upper transparent conductive layer 190r and the semitransparent conductive layer 190q (FIG. 10) are etched through photolithography by using the second photosensitive pattern 60a as a mask to form a semitransparent conductive layer 193 and an upper transparent conductive layer 194 which are positioned on the lower transparent conductive layer 192. The lower transparent conductive layer 192, the semitransparent conductive layer 193 and the upper transparent conductive layer 194 form the pixel electrode 191G of the green pixel (G).

Figure 13:
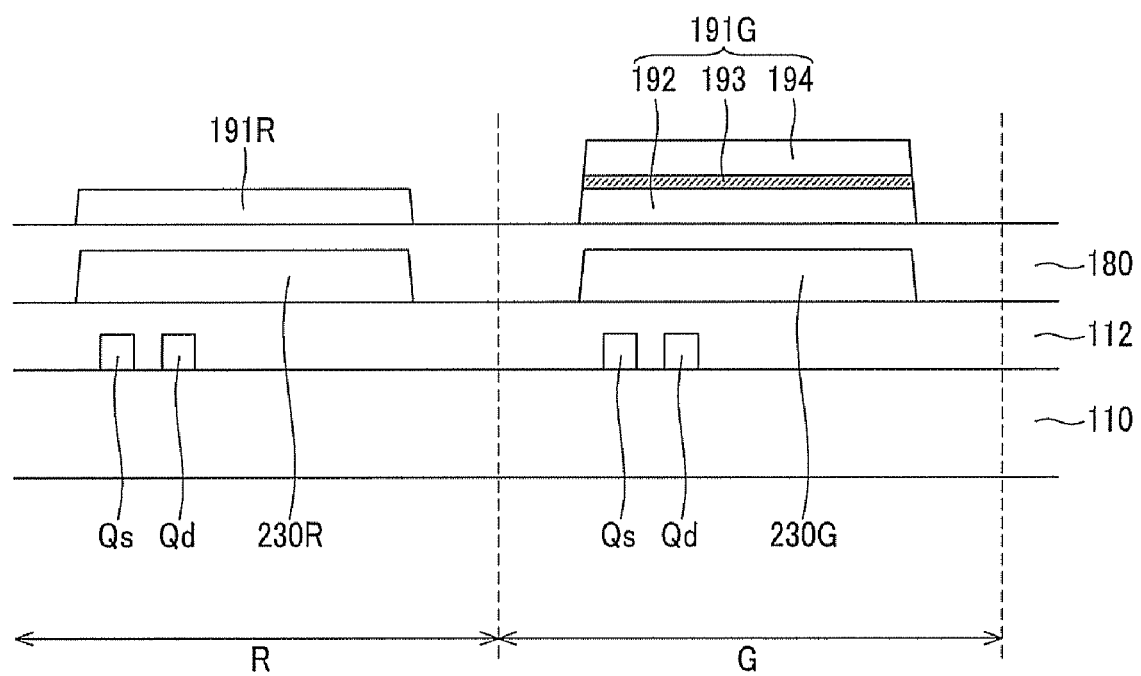

As shown in FIG. 13, the first photosensitive pattern 40a (FIG. 12) at the red pixel (R) and the second photosensitive pattern 60a (FIG. 12) at the green pixel (G) are simultaneously removed.

Figure 14:
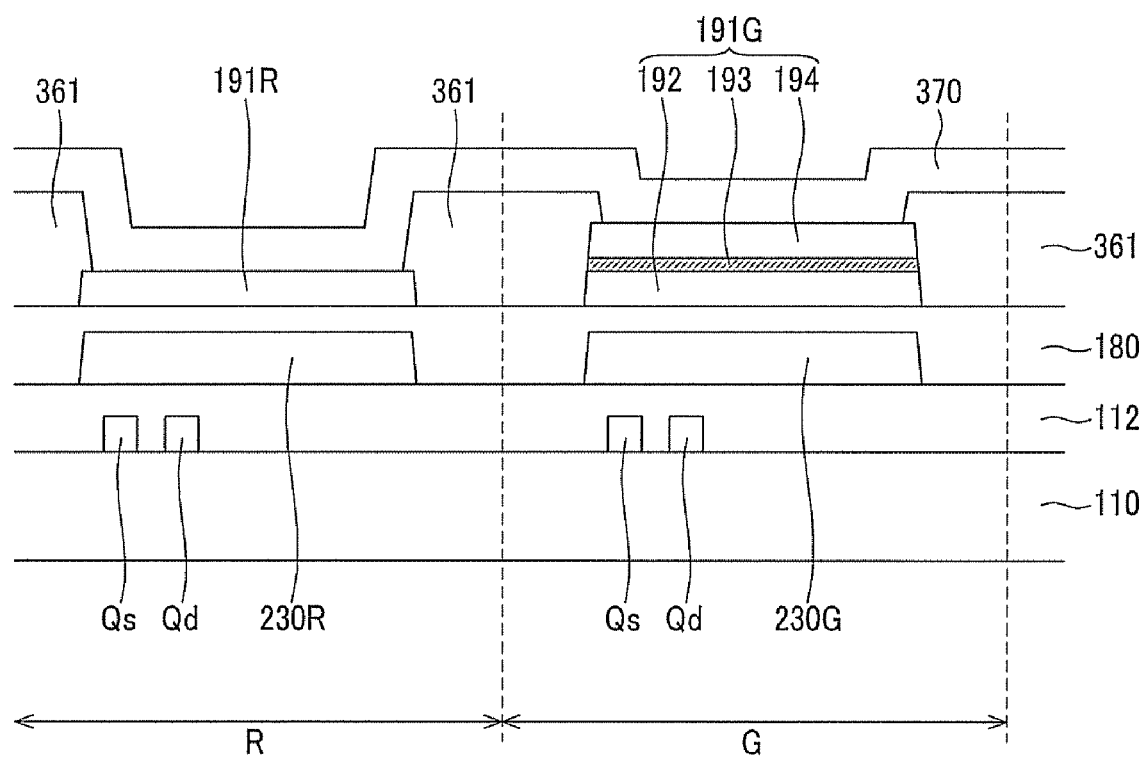

As shown in FIG. 14, an insulating layer is coated on the pixel electrodes 191R and 191G and on the upper insulating layer 180 and then patterned to form an insulating layer 361 having a plurality of openings exposing the pixel electrodes 191R and 191G.

The emission layer 370 is then formed by sequentially stacking a red emission layer (not shown), a blue emission layer (not shown) and a green emission layer (not shown) on the entire surface of the substrate 110. In this case, the red emission layer, the blue emission layer and the green emission layer may be repeatedly stacked two or more times.

Subsequently, the common electrode 270 (FIG. 4) is formed on the emission layer 370.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising first to third pixels each displaying a different color, wherein each pixel comprises:
    a first electrode;
    a second electrode facing the first electrode; and
    an emission layer sandwiched between the first and second electrodes,
    wherein first electrodes of first and second pixels are a single layer comprising a conductive oxide, respectively, and
    a first electrode of the third pixel comprises
    a lower first electrode comprising a conductive oxide,
    an intermediate first electrode formed on the lower first electrode and comprising a semitransparent conductor, and
    an upper first electrode formed on the intermediate first electrode and comprising a conductive oxide.

2. The OLED display of claim 1, wherein the intermediate first electrode forms microcavities with the second electrode.

3. The OLED display of claim 2, wherein the first pixel is a red pixel, the second pixel is a blue pixel and the third pixel is a green pixel.

4. The OLED display of claim 3, wherein the emission layer comprises a plurality of sub-emission layers each emitting light of a different wavelength, and which emits white light by combining the lights of different wavelengths.

5. The OLED display of claim 4, wherein the emission layer comprises:
    a first sub-emission layer which emits light of a first color;
    a second sub-emission layer which emits light of a second color; and
    a third sub-emission layer which emits light of a third color,
    wherein the first to third sub-emission layers are repeatedly stacked at least twice.

6. The OLED display of claim 4, wherein the first to third pixels further comprise a color filter formed under the first electrode, respectively.

7. The OLED display of claim 6, wherein the first electrodes of the first and second pixels and the lower first electrode of the third pixel are formed on the same layer.

8. The OLED display of claim 6, wherein the intermediate first electrode is thinner than the lower first electrode and the upper first electrode.

9. The OLED display of claim 8, wherein the upper first electrode has a thickness of about 300 Å to about 2000 Å.

10. The OLED display of claim 9, wherein the intermediate first electrode has a thickness of about 50 Å to about 300 Å.

11. The OLED display of claim 6, wherein the lower and upper first electrodes comprise at least one selected from among ITO, IZO and ZnO.

12. The OLED display of claim 11, wherein the intermediate first electrode comprises at least one selected from among silver (Ag), aluminum (Al), gold (Au), nickel (Ni), magnesium (Mg) and an alloy of at least one of the foregoing.

13. The OLED display of claim 3, further comprising a white pixel, wherein the white pixel comprises:
    a first electrode;
    a second electrode facing the first electrode; and
    an emission layer sandwiched between the first and second electrodes,
    wherein the first electrode of the white pixel is a single layer comprising a conductive oxide.

* * * * *